(12) United States Patent
Shiraishi et al.

(10) Patent No.: US 8,970,261 B2
(45) Date of Patent: Mar. 3, 2015

(54) POWER MODULE

(71) Applicants: Takuya Shiraishi, Tokyo (JP); Tomofumi Tanaka, Tokyo (JP)

(72) Inventors: Takuya Shiraishi, Tokyo (JP); Tomofumi Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/794,630

(22) Filed: Mar. 11, 2013

(65) Prior Publication Data

US 2014/0055173 A1 Feb. 27, 2014

(30) Foreign Application Priority Data

Aug. 21, 2012 (JP) ................................. 2012-181982

(51) Int. Cl.
*H03B 1/00* (2006.01)
*H01L 27/06* (2006.01)
*H03K 17/56* (2006.01)

(52) U.S. Cl.
CPC ............ *H01L 27/0617* (2013.01); *H03K 17/56* (2013.01); *H01L 2224/48091* (2013.01); *H01L 2224/48137* (2013.01); *Y02B 70/1483* (2013.01)
USPC .......................................... 327/109; 327/434

(58) Field of Classification Search
None
See application file for complete search history.

(56) References Cited

U.S. PATENT DOCUMENTS

| 6,248,461 | B1 | 6/2001 | Abe et al. | |
| 6,529,062 | B2* | 3/2003 | Majumdar et al. | ............ 327/434 |
| 7,449,774 | B1 | 11/2008 | Jeun et al. | |
| 7,501,700 | B2 | 3/2009 | Jeun et al. | |
| 7,741,883 | B2* | 6/2010 | Fuller et al. | .................... 327/108 |
| 2008/0017882 | A1* | 1/2008 | Nakanishi et al. | ............ 257/177 |
| 2008/0304300 | A1* | 12/2008 | Raju et al. | ...................... 363/126 |
| 2009/0115038 | A1* | 5/2009 | Son et al. | ....................... 257/675 |
| 2009/0194859 | A1* | 8/2009 | Kang et al. | .................... 257/676 |
| 2011/0260305 | A1* | 10/2011 | Saboco | ......................... 257/670 |
| 2012/0014069 | A1* | 1/2012 | Zeng et al. | ..................... 361/718 |
| 2012/0038033 | A1* | 2/2012 | Oga et al. | ...................... 257/659 |
| 2012/0057387 | A1* | 3/2012 | Lai et al. | ....................... 363/132 |
| 2012/0235710 | A1* | 9/2012 | Roessler et al. | ............... 327/109 |
| 2012/0326289 | A1* | 12/2012 | Minamio | ...................... 257/676 |

FOREIGN PATENT DOCUMENTS

| JP | 04-354156 A | 12/1992 |
| JP | 2000-260451 A | 9/2000 |
| JP | 2009-252885 A | 10/2009 |
| KR | 1020010035579 A | 5/2001 |
| KR | 1020010056163 A | 7/2001 |

OTHER PUBLICATIONS

Korean Office Action; KR10-2013-0069423; Mar. 27, 2014.

* cited by examiner

*Primary Examiner* — Cassandra Cox

(74) *Attorney, Agent, or Firm* — Studebaker & Brackett PC

(57) ABSTRACT

A power module includes an IGBT; a MOSFET connected in parallel with the IGBT; a lead frame having a first frame portion on which the IGBT is mounted and a second frame portion on which the MOSFET is mounted, and having a step by which the first frame portion is located at a first height and the second frame portion is located at a second height larger than the first height; and an insulation sheet for a heat sink which is disposed on an underside of only the first frame portion of the lead frame.

5 Claims, 2 Drawing Sheets

US 8,970,261 B2

POWER MODULE

BACKGROUND OF THE INVENTION

1. Field of the Invention

The present invention relates to a power module such as a transfer-mold type IPM (Intelligent Power Module).

2. Description of the Background Art

In a power module used for an inverter, with a conventional configuration in which an IGBT (Insulated Gate Bipolar Transistor) and an FWD (Free Wheeling Diode) are connected in parallel with each other, it is difficult to reduce losses in the low current range due to the characteristics of the IGBT.

To improve losses in the low current range, it is considered to use a MOSFET (Metal-Oxide-Semiconductor Field-Effect Transistor) instead of an IGBT. However, with the MOSFET, there is a problem that the allowable current decreases, since the on-voltage in the high temperature/high current range increases.

To solve such problem, there is considered a configuration in which an IGBT with a low saturation voltage in the large current range is connected in parallel with a MOSFET with a low saturation voltage in the small current range (see, for example, Japanese Patent Application Laid-Open No. 04-354156 (1992)).

However, the configuration described in Japanese Patent Application Laid-Open No. 04-354156 (1992) is lacking in the viewpoint of adjustment of loss sharing between the IGBT and the MOSFET. Hence, there is a problem that the cost-performance of a power module cannot be optimized by the above-described adjustment.

SUMMARY OF THE INVENTION

An object of the present invention is to provide a power module capable of improving cost-performance by adjusting loss sharing between an IGBT and a MOSFET.

A power module according to the present invention includes an IGBT and a MOSFET connected in parallel with the IGBT. Furthermore, the power module includes a lead frame having a first frame portion on which the IGBT is mounted and a second frame portion on which the MOSFET is mounted, and having a step by which the first frame portion is located at a first height and the second frame portion is located at a second height larger than the first height. Furthermore, the power module includes an insulation sheet for a heat sink which is disposed on an underside of only the first frame portion of the lead frame.

According to the present invention, since the current-carrying capability of the MOSFET is smaller than that of the IGBT upon passage of high current, by increasing the loss burden on the IGBT side and reducing the loss burden on the MOSFET side, it becomes unnecessary for the MOSFET to have high heat sink performance. Therefore, an insulation sheet is disposed on the underside of only the first frame portion which is a location where the IGBT requiring high heat sink performance is mounted, and an insulation sheet does not need to be disposed at a location of the lead frame where the MOSFET is mounted. Thus, the sheet size of the insulation sheet can be reduced. With the above, the manufacturing cost of the power module can be reduced.

In the lead frame, the step by which the first frame portion is located at the first height and the second frame portion is located at the second height larger than the first height is formed, and accordingly, the distance from a heat sink surface which is the side where the IGBT is placed to the MOSFET can be increased, enabling to secure predetermined insulation performance of the MOSFET. In addition, since the current-carrying capability of the MOSFET is smaller than that of the IGBT upon passage of high current, the chip size of the MOSFET can be reduced. Therefore, the manufacturing cost of the power module can be further reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
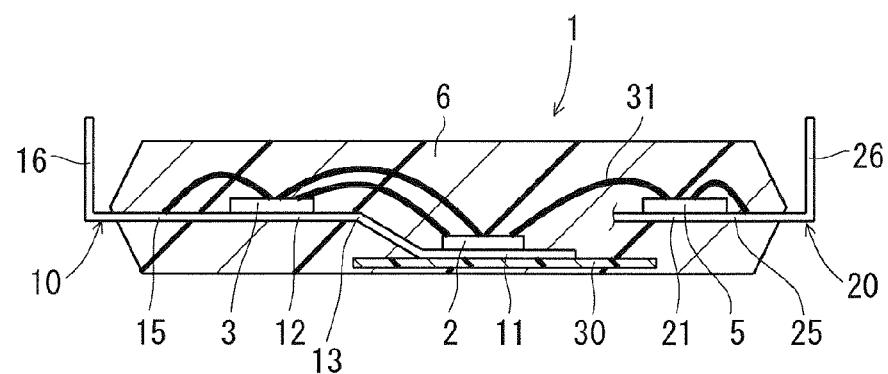
FIG. 1 is a cross-sectional view of a power module according to a first preferred embodiment.
Figure 2:
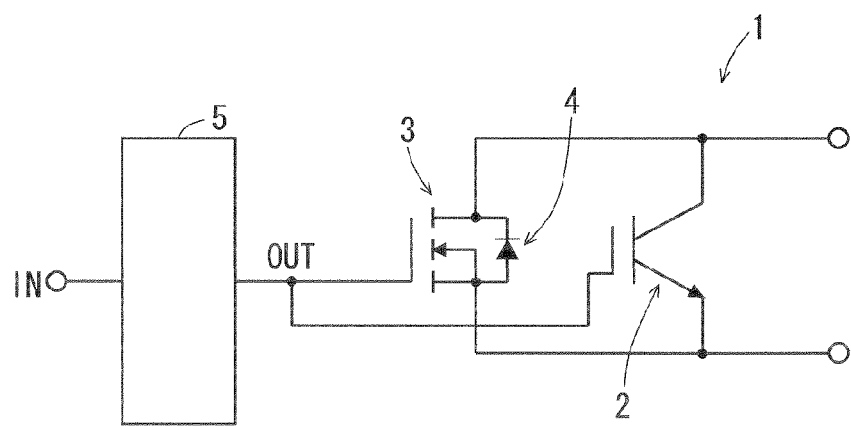
FIG. 2 is a circuit diagram of the power module.

A first preferred embodiment of the present invention will be described below using the drawings. FIG. 1 is a cross-sectional view of a power module 1 according to the first preferred embodiment of the present invention, and FIG. 2 is a circuit diagram of the power module 1. As shown in FIG. 1, the power module 1 includes an IGBT 2, a MOSFET 3, a drive circuit 5, lead frames 10 and 20, an insulation sheet 30 for a heat sink, and a mold resin 6.

The lead frame 10 has an inner lead 15 which is electrically connected to the IGBT 2 and the MOSFET 3; and an outer lead 16 connected to the inner lead 15. The inner lead 15 has a first frame portion 11 located in a predetermined height position (first height); and a second frame portion 12 located in a height position (second height) larger than the height position of the first frame portion 11. The second frame portion 12 and the first frame portion 11 are formed in this order from the side of the outer lead 16. A step 13 is formed between the first frame portion 11 and the second frame portion 12. The IGBT 2 is mounted on the first frame portion 11, and the MOSFET 3 is mounted on the second frame portion 12.

The insulation sheet 30 is disposed on the underside of only the first frame portion 11. Here, since the power module 1 is used in a state of being placed on a conductive heat sink (not shown), the insulation sheet 30 is disposed for the purpose of insulating the lead frame 10 from the heat sink.

By increasing the distance from a heat sink surface of the power module 1, i.e., a placement surface of the power module 1 that comes into contact with the heat sink, to the MOSFET 3, the MOSFET 3 can secure predetermined insulation performance with respect to the heat sink surface. Hence, disposition of the insulation sheet 30 on the underside of the second frame portion 12 can be omitted.

The drive circuit 5 is a circuit for driving the IGBT 2 and the MOSFET 3. The drive circuit 5 is mounted on a third frame portion 21 of the lead frame 20. The lead frame 20 has an inner lead 25 which is electrically connected to the drive circuit 5; and an outer lead 26 connected to the inner lead 25. The third frame portion 21 is formed in the inner lead 25 and is formed in a height position larger than the height position of the first frame portion 11. The IGBT 2, the MOSFET 3, the drive circuit 5, the insulation sheet 30, and the inner leads 15 and 25 of the lead frames 10 and 20 are sealed with the mold resin 6.

As shown in FIG. 2, the IGBT 2 and the MOSFET 3 are connected in parallel with each other. More specifically, a collector of the IGBT 2 is connected to a drain of the MOSFET 3, and an emitter of the IGBT 2 is connected to a source of the MOSFET 3. A gate of the IGBT 2 and a gate of the MOSFET 3 are connected to an output terminal of the drive circuit 5. Note that a diode 4 is connected in anti-parallel with the MOSFET 3, and is an internal parasitic diode 4.

Here, the current-carrying capability of the MOSFET 3 is smaller than that of the IGBT 2 upon passage of high current such as when the maximum rated current of the module flows, e.g., upon heavy load drive. Therefore, on the side of the MOSFET 3, the current flowing upon passage of high current is suppressed and thus transient losses are reduced.

The threshold voltage of the MOSFET 3 is set to be higher than that of the IGBT 2 so that all currents flow through the side of the IGBT 2 in a transient state upon switching.

In a configuration in which the IGBT 2 and the MOSFET 3 are used in parallel as a switching device, generally, a sequence in which the IGBT 2 is always turned off first and then the MOSFET 3 is turned off is adopted which is implemented by setting the threshold voltage of the MOSFET 3 to be lower.

The advantageous effect obtained in this case is that tail current is suppressed and thus turn-off losses can be reduced. However, in a transient state, all currents (IGBT current+ MOSFET current) always flow through the MOSFET 3, resulting in an increase in the temperature of the MOSFET 3.

In contrast to this, in the present preferred embodiment, by setting the threshold voltage of the MOSFET 3 to be higher than that of the IGBT 2, the current flowing through the MOSFET 3 upon switching is suppressed, by which an increase in the temperature of the MOSFET 3 is suppressed. Here, the threshold voltages of the IGBT 2 and the MOSFET 3 are set according to the amount of impurity for channel implantation upon manufacturing.

Next, the circuit operation of the power module 1 will be described. In the case of going into a turn-on state by a control signal which is outputted from the output terminal of the drive circuit 5 changing from a low potential ("L") to a high potential ("H"), when a gate voltage is provided to the IGBT 2 and the MOSFET 3, since the threshold voltage of the IGBT 2 is lower, the IGBT 2 is turned on first, and an IGBT current starts to flow.

In the meantime, when the gate voltage reaches the threshold voltage of the MOSFET 3, the MOSFET 3 is turned on, and a MOSFET current starts to flow. At the point in time when the MOSFET 3 is turned on, since a predetermined period of time has elapsed since the IGBT 2 has been turned on, the IGBT 2 is in a steady state. Thus, almost all currents have flown through the IGBT 2 and almost no current flows through the MOSFET 3.

As such, by setting the threshold voltage of the MOSFET 3 to be higher than that of the IGBT 2, the current flowing through the MOSFET 3 upon turn-on can be suppressed. Therefore, an increase in the temperature of the MOSFET 3 can be suppressed.

In the case of going into a turn-off state by the control signal changing from "H" to "L", when the gate voltage provided to the IGBT 2 and the MOSFET 3 starts to drop, since the threshold voltage of the MSOFET 3 is higher, the MOSFET 3 is turned off first and the MOSFET current starts to drop. Thereafter, the gate voltage decreases, by which the IGBT current starts to drop and becomes lower than the threshold voltage of the IGBT 2. Therefore, the IGBT 2 is turned off and the IGBT current stops flowing. By thus setting the threshold voltage of the MOSFET 3 to be higher than that of the IGBT 2, the MOSFET 3 is turned off first upon turn-off. Thus, all currents flow through the IGBT 2 being in an on state at that point in time, and no current flows through the MOSFET 3. Therefore, an increase in the temperature of the MOSFET 3 can be suppressed.

Figure 5:
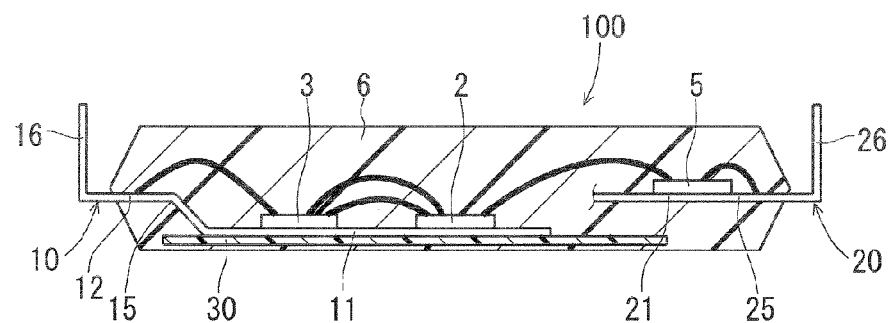
FIG. 5 is a cross-sectional view of a power module according to a comparative example.

Next, advantageous effects brought about by the power module 1 according to the first preferred embodiment will be described by comparing the power module 1 with a power module 100 according to a comparative example. FIG. 5 is a cross-sectional view of the power module 100 according to the comparative example. Note that, in the comparative example, the same components as those of the power module 1 are denoted by the same reference characters and description thereof is omitted.

In the power module 100 according to the comparative example, a lead frame 10 has a first frame portion 11 and a second frame portion 12, and an IGBT 2 and a MOSFET 3 are mounted on the first frame portion 11. Since the IGBT 2 and the MOSFET 3 are mounted on the first frame portion 11, the distance from a heat sink surface to the IGBT 2 and the MOSFET 3 is reduced. Hence, in order to secure predetermined insulation performance of the MOSFET 3 with respect to the heat sink surface, there is a need to dispose an insulation sheet 30 not only underneath the IGBT 2 but also underneath the MOSFET 3.

In contrast to this, in the power module 1 according to the first preferred embodiment, the second frame portion 12 is formed in a height position larger than the first frame portion 11, and the IGBT 2 is mounted on the first frame portion 11 and the MOSFET 3 is mounted on the second frame portion 12. Hence, the distance from the heat sink surface to the MOSFET 3 increases, enabling to secure the predetermined insulation performance of the MOSFET 3 with respect to the heat sink surface. Therefore, the insulation sheet 30 needs to be disposed on the underside of only the first frame portion 11 and does not need to be disposed on the underside of the second frame portion 12.

As described above, in the power module 1 according to the first preferred embodiment, since the current-carrying capability of the MOSFET 3 upon passage of high current is smaller than that of the IGBT 2, the loss burden on the side of the IGBT 2 can be increased and the loss burden on the side of the MOSFET 3 can be reduced, eliminating the need for the MOSFET 3 to have high heat sink performance. Therefore, the insulation sheet 30 is not disposed at a location of the lead frame 10 where the MOSFET 3 is mounted, and the insulation sheet 30 is disposed on the underside of only the first frame portion 11 which is a location where the IGBT 2 requiring high heat sink performance is mounted. Thus, the chip size of the MOSFET 3 can be reduced. In addition to this, since the sheet size of the insulation sheet 30 can also be reduced, the manufacturing cost of the power module 1 can be reduced.

In addition, in the lead frame 10, the step 13 by which the first frame portion 11 is located at the first height and the second frame portion 12 is located at the second height larger than the first height is formed, and accordingly, the distance from the heat sink surface to the MOSFET 3 can be increased, enabling to secure the predetermined insulation performance of the MOSFET 3.

In addition, since the current-carrying capability of the MOSFET 3 upon passage of high current is smaller than that of the IGBT 2, the chip size of the MOSFET 3 can be further reduced. Therefore, the manufacturing cost of the power module 1 can be further reduced.

In addition, since the on-threshold voltage of the MOSFET 3 is higher than that of the IGBT 2, even in a transient state upon overload, a large current can be prevented from flowing through the MOSFET 3. Therefore, switching transient losses in the MOSFET 3 are reduced and an increase in the temperature of the MOSFET 3 is suppressed, enabling to improve the long-term reliability of the power module 1. By improving the long-term reliability of the power module 1, long-term use is possible, leading to a reduction in the amount of energy consumption.

Note that instead of setting the threshold voltage of the MOSFET 3 to be higher than that of the IGBT 2, the drive circuit 5 may individually output control signals to the IGBT 2 and the MOSFET 3 to individually drive the IGBT 2 and the MOSFET 3. In this case, by the drive circuit 5 driving the IGBT 2 and the MOSFET 3 such that the IGBT 2 and the MOSFET 3 are turned on in this order and the MOSFET 3 and the IGBT 2 are turned off in this order, the same advantageous effects as those obtained when the threshold voltage of the MOSFET 3 is set to be higher than that of the IGBT 2 are obtained. Here, a configuration in which the threshold voltage of the MOSFET 3 is set to be higher than that of the IGBT 2 and a configuration in which the drive circuit 5 individually drives the IGBT 2 and the MOSFET 3 are not essential and may be omitted.

In addition, as a MOSFET, a SiC-MOSFET formed on a silicon carbide (SiC) substrate may be adopted. Since the SiC-MOSFET has a lower on-threshold voltage compared to the Si-MOSFET, in the case of, in particular, turn-off, the SiC-MOSFET is turned off at a lower temperature than that for when the Si-MOSFET is adopted, resulting in low losses. Thus, an increase in the temperature of the MOSFET can be further suppressed, enabling to further improve the long-term reliability of the power module 1.

Second Preferred Embodiment

Figure 3:
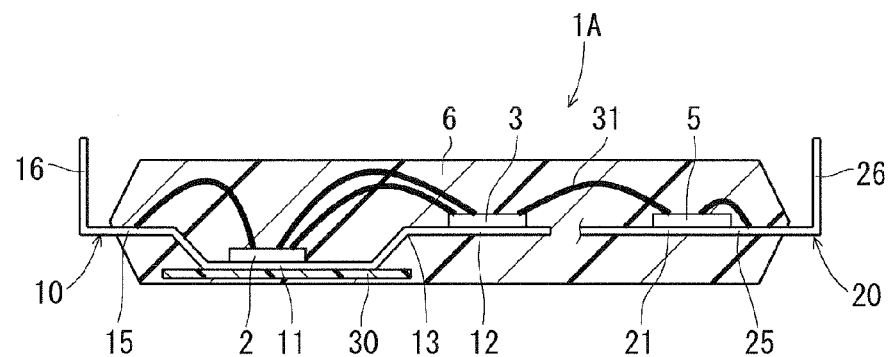
FIG. 3 is a cross-sectional view of a power module according to a second preferred embodiment.

Next, a power module 1A according to a second preferred embodiment will be described. FIG. 3 is a cross-sectional view of the power module 1A according to the second preferred embodiment of the present invention. Note that, in the second preferred embodiment, the same components as those described in the first preferred embodiment are denoted by the same reference characters and description thereof is omitted.

In a lead frame 10, a first frame portion 11 and a second frame portion 12 are formed in this order from the side of an outer lead 16, and a third frame portion 21 on which a drive circuit 5 is mounted is located in a position adjacent to the second frame portion 12. The third frame portion 21 is formed in a height position (third height) larger than the height position of the first frame portion 11. For example, the height position of the third frame portion 21 is the same as the height position of the second frame portion 12. Hence, the wiring length of a wire 31 between the drive circuit 5 and a power chip (an IGBT 2 and a MOSFET 3) in the second preferred embodiment is shorter than the wiring length of a wire 31 between the drive circuit 5 and a power chip in the first preferred embodiment shown in FIG. 1.

As described above, the power module 1A according to the second preferred embodiment further includes another lead frame 20 having the third frame portion 21 on which the drive circuit 5 is mounted, and the third frame portion 21 is formed at the third height larger than a first height, and the third frame portion 21 is adjacent to the second frame portion 12 of the first frame portion 11 and the second frame portion 12. Thus, the wiring length of the wire 31 between the drive circuit 5 and the power chip can be reduced. Therefore, wire sweep caused by a mold resin 6 can be prevented, enabling to achieve an improvement in the quality of the product. As such, achievement of an improvement in the quality of the product also leads to an improvement in yield.

Third Preferred Embodiment

Figure 4:
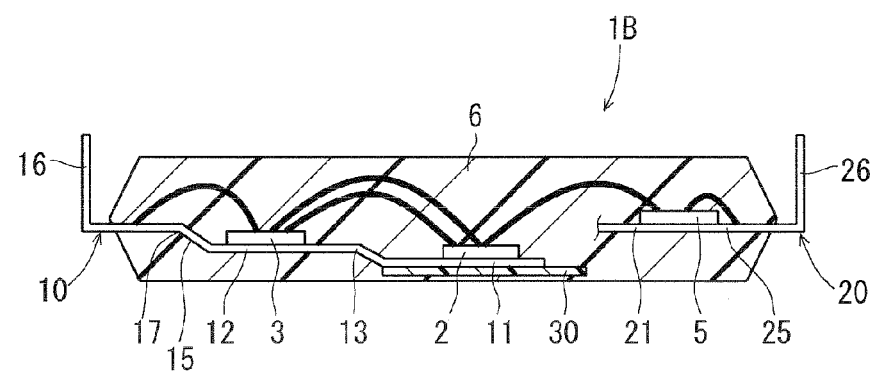
FIG. 4 is a cross-sectional view of a power module according to a third preferred embodiment.

Next, a power module 1B according to a third preferred embodiment will be described. FIG. 4 shows the power module 1B according to the third preferred embodiment of the present invention. Note that, in the third preferred embodiment, the same components as those described in the first and second preferred embodiments are denoted by the same reference characters and description thereof is omitted.

In a lead frame 10, a step 17 which is different than the step 13 is further formed between a first frame portion 11 or a second frame portion 12, and an outer lead 16. Specifically, the step 17 is formed between the second frame portion 12 and the outer lead 16, and the height position of the second frame portion 12 is a bit lower compared to the case of the first preferred embodiment. Hence, the distance from an IGBT 2 to a MOSFET 3 is a bit shorter compared to the case of the first preferred embodiment, and thus, thermal resistance decreases compared to the case of the first preferred embodiment.

As described above, in the power module 1B according to the third preferred embodiment, in the lead frame 10, the other step 17 which is different than the step 13 is further formed between the first frame portion 11 or the second frame portion 12, and the outer lead 16. Thus, while required insulation properties are secured, the distance from the IGBT 2 to the MOSFET 3 becomes a bit shorter compared to the case in which the step 17 is not provided, by which the thermal resistance of the MOSFET 3 can be reduced. Therefore, an increase in the temperature of the MOSFET 3 can be suppressed, which in turn enables to improve the long-term reliability of the power module 1B.

Note that the preferred embodiments may be freely combined or may be appropriately modified or omitted without departing from the spirit and scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A power module comprising:
   an IGBT;
   a MOSFET connected in parallel with said IGBT, an on-threshold voltage of said MOSFET being higher than an on-threshold voltage of said IGBT;
   a lead frame having a first frame portion on which said IGBT is mounted, and a second frame portion on which said MOSFET is mounted, and having a step by which said first frame portion is located at a first height and said second frame portion is located at a second height larger than said first height; and
   an insulation sheet for a heat sink disposed on an underside of only said first frame portion of said lead frame.

2. The power module according to claim 1, further comprising a drive circuit that drives said IGBT and said MOSFET, wherein said drive circuit drives said IGBT and said MOSFET such that said IGBT and said MOSFET are turned on in this order and said MOSFET and said IGBT are turned off in this order.

3. The power module according to claim 1, wherein said MOSFET is a SiC-MOSFET.

4. The power module according to claim 2, further comprising another lead frame having a third frame portion on which said drive circuit is mounted, wherein said third frame portion is formed at a third height larger than said first height, and said third frame portion is adjacent to said second frame portion of said first and second frame portions.

5. The power module according to claim 1, further comprising a mold resin that seals said IGBT, said MOSFET, and an inner lead of said lead frame, wherein in said lead frame, another step different than said step is further formed between said first frame portion or said second frame portion, and an outer lead.

* * * * *